US012787178B2

(12) United States Patent
Iijima

(10) Patent No.: US 12,787,178 B2
(45) Date of Patent: Nov. 3, 2026

(54) ELECTRONIC DEVICE

(71) Applicant: HITACHI ASTEMO, LTD., Hitachinaka (JP)

(72) Inventor: Fumiya Iijima, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 166 days.

(21) Appl. No.: 18/690,971

(22) PCT Filed: Aug. 1, 2022

(86) PCT No.: PCT/JP2022/029417
§ 371 (c)(1),
(2) Date: Mar. 11, 2024

(87) PCT Pub. No.: WO2023/095386
PCT Pub. Date: Jun. 1, 2023

(65) Prior Publication Data

US 2024/0381535 A1 Nov. 14, 2024

(30) Foreign Application Priority Data

Nov. 29, 2021 (JP) ................................ 2021-192661

(51) Int. Cl.
*H05K 1/181* (2026.01)
*H05K 1/02* (2006.01)

(52) U.S. Cl.
CPC ........... *H05K 1/181* (2013.01); *H05K 1/0277* (2013.01)

(58) Field of Classification Search
CPC .... H05K 1/0277; H05K 1/0278; H05K 1/028; H02K 11/30
See application file for complete search history.

(56) References Cited

U.S. PATENT DOCUMENTS

2017/0149111 A1* 5/2017 Yosui ...................... H01P 3/082
2018/0069560 A1 3/2018 Tamura et al.
2020/0321839 A1* 10/2020 Tateyama .............. H05K 1/028

FOREIGN PATENT DOCUMENTS

CN 205385652 U * 7/2016
CN 211557633 U 9/2020
JP H11-298094 A 10/1999
JP 2010-105640 A 5/2010
JP 2014-060903 A 4/2014
(Continued)

OTHER PUBLICATIONS

CN-205385652-U Machine translation (Year: 2016).*
(Continued)

*Primary Examiner* — Nathan Milakovich
(74) *Attorney, Agent, or Firm* — FOLEY & LARDNER LLP

(57) ABSTRACT

A bendable circuit substrate (3) is provided with a first rigid part (11), a second rigid part (12) and a flexible part (13). The first rigid part (11) is provided with power source terminals (40) (positive electrode terminal (40A), negative electrode terminal (40B)), and power is supplied to the second rigid part (12) via power source positive electrode wirings (BA) of the flexible part (13). The power source positive electrode wirings (BA) are provided to the respective first layer and the second layer so as to be superimposed on each other in the lamination direction, in the flexible part (13).

8 Claims, 17 Drawing Sheets

(56) References Cited

FOREIGN PATENT DOCUMENTS

| | | | |
|---|---|---|---|
| JP | 2017-212413 | A | 11/2017 |
| JP | 2018-042079 | A | 3/2018 |
| WO | WO-2019/131991 | A1 | 7/2019 |

OTHER PUBLICATIONS

International Search Report dated Oct. 18, 2022 issued in International Application No. PCT/JP2022/029417, with English translation, 6 pages.

Written Opinion of the International Searching Authority dated Oct. 18, 2022 issued in International Application No. PCT/JP2022/029417, with English translation, 8 pages.

* cited by examiner

ELECTRONIC DEVICE

TECHNICAL FIELD

The present invention relates to an electronic device using a bendable circuit substrate which can be mounted in a housing in a bent state.

BACKGROUND TECHNOLOGY

In a patent document 1, as a circuit substrate mounted in a motor unit of a power steering apparatus, a multilayer wiring substrate is disclosed which is formed by connecting a plurality of rigid parts with flexible parts which are thinner than the rigid parts, so as to be used in a bent form having a substantially U-shape.

In a patent document 2, as a flexible wiring substrate used for power supply of a heater in an atomic oscillator, there is shown a configuration in which a positive wiring and a negative wiring are laminated close to each other via an insulating layer so as to offset the effect of a magnetic field of each of them.

In a circuit substrate used by being bent in a substantially U-shape as shown in the patent document 1, if a power source input terminal is provided to each of the rigid parts, the component mounting areas of the rigid parts are reduced by the power source input terminals, and it is therefore not preferable. On the other hand, if one of the rigid parts is provided with no power source input terminal, it is necessary to provide a wiring for power supply to the flexible parts between the rigid parts, and problems such as noise to another signal wiring and disconnection peculiar to the flexible parts occur.

In addition, the patent document 2 discloses a configuration in which a positive wiring and a negative wiring are arranged close to each other and is not one which discloses a configuration in which two power source positive electrode wirings are laminated as shown in the present invention.

PRIOR ART REFERENCES

Patent Documents

Patent Document 1: Japanese Patent Application Publication No. 2014-60903

Patent Document 2: Japanese Patent Application Publication No. 2018-42089 2018-042079.

SUMMARY OF THE INVENTION

The present invention, in one aspect thereof, is an electronic device including a multilayer circuit substrate on which an electronic component is mounted, wherein the circuit substrate includes: at least two component mounting parts on which the electronic component is mounted; a flexible part positioned between adjacent two of the component mounting parts and formed to be thinner than a thickness of a substrates of each of the component mounting parts so as to have higher flexibility than that of each of the component mounting parts; a power source input terminal provided on one of the component mounting parts; and at least two power source positive electrode wirings extending between the two component mounting parts in the flexible part to supply power to one of the component mounting parts to which the power source input terminals are not provided, provided to respective layers different from each other, and arranged at respective positions at which they are at least partially superimposed on each other when being projected in a lamination direction of the circuit substrate.

According to the present invention, at least one component mounting part is not provided with a power source input terminal, and a component mounting area increases. In addition, at least two power source positive electrode wirings are provided to each of different layers in the flexible part so as to be mutually superimposed. Consequently, the wiring width of each of the power source positive electrode wirings can be narrowed, and the effect of noise to other signal wirings can be reduced. In addition, even if one power source positive electrode wiring is disconnected, power supply can be continued.

MODE FOR IMPLEMENTING THE INVENTION

In the following, one embodiment in which the present invention is applied, for example, to a control device for an electric power steering apparatus of a vehicle will be explained in detail based on the drawings.

Figure 1:
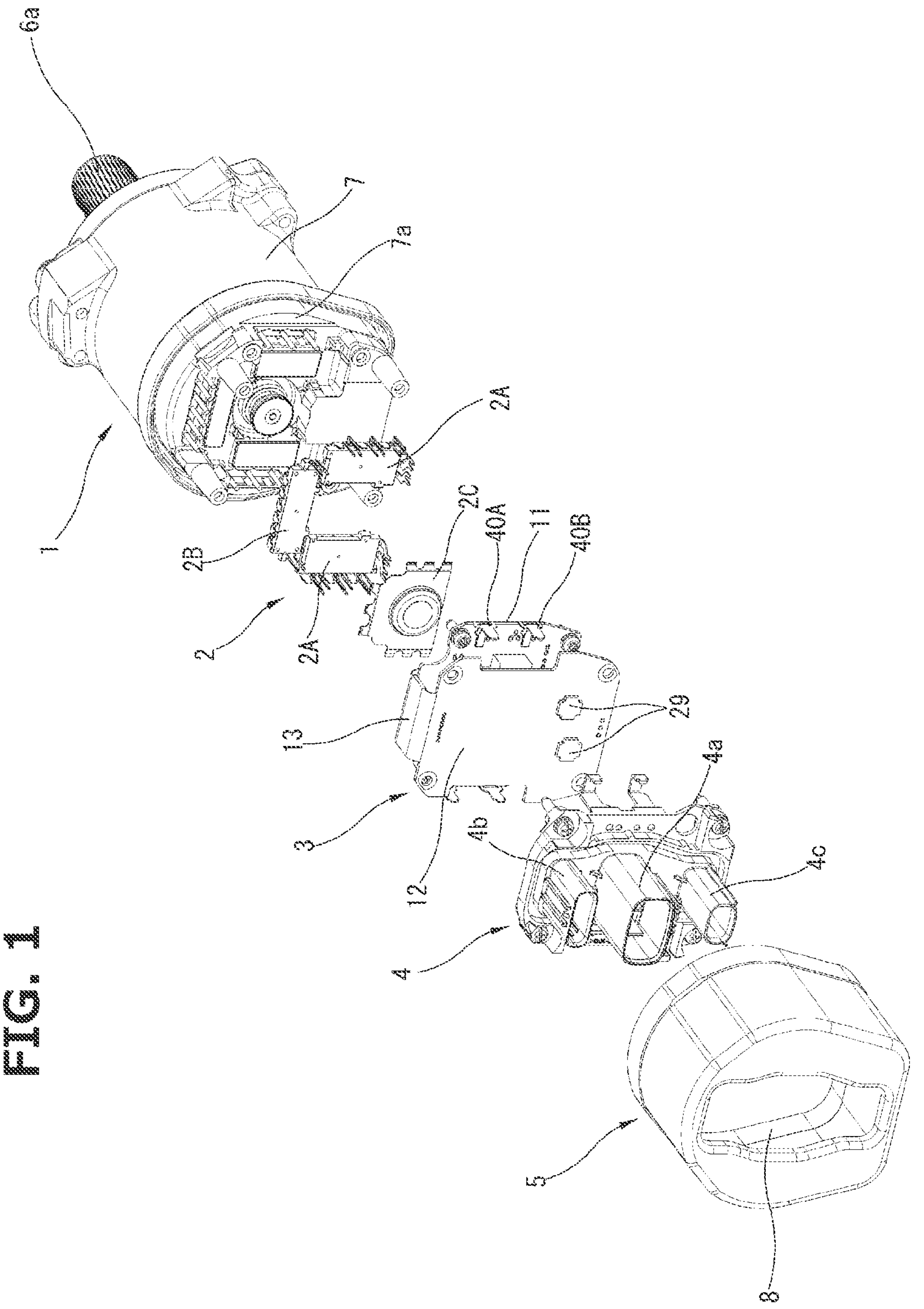
FIG. 1 is a perspective exploded view of an electric actuator device for a power steering apparatus into which a circuit substrate according to the present invention is incorporated.
Figure 2:
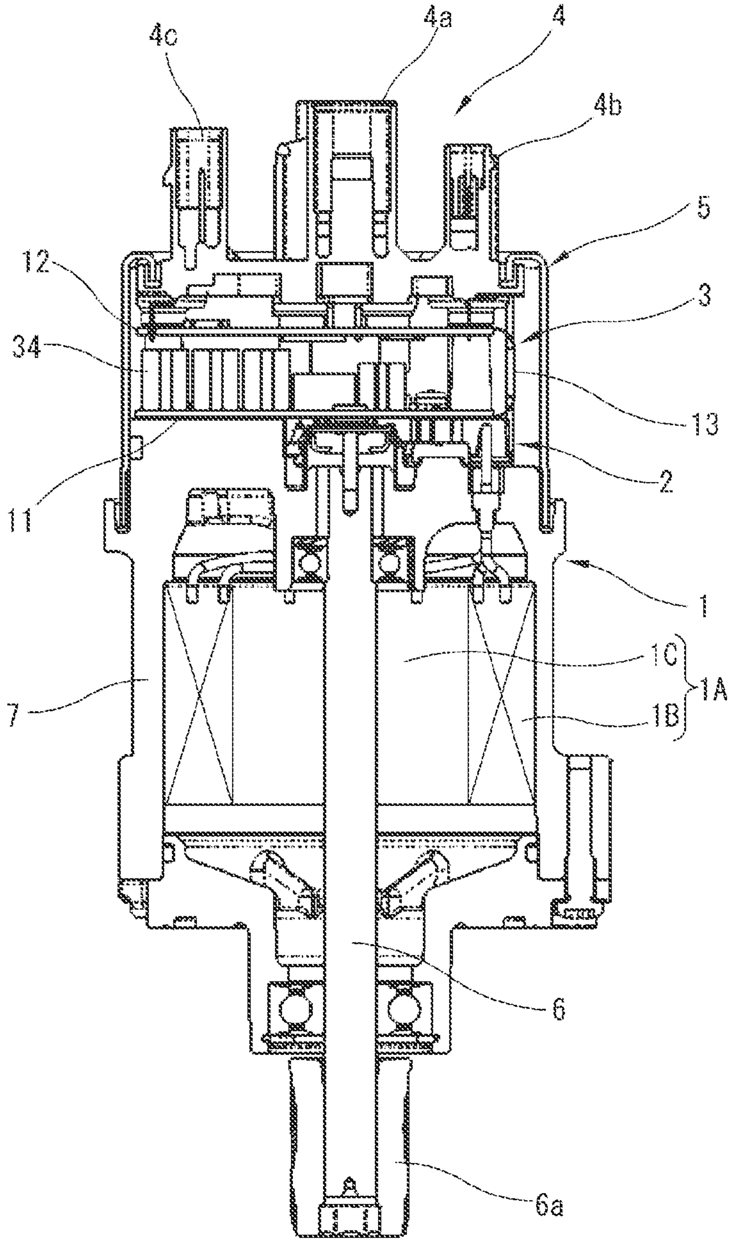
FIG. 2 is a sectional view of the electric actuator device.

FIG. 1 is a perspective exploded view of an electric actuator device for applying steering auxiliary force to a steering mechanism which is not shown in the drawings, in an electric power steering apparatus. In addition, FIG. 2 is a sectional view of the electric actuator device. This electric actuator device is provided with a cylindrical motor part 1, an inverter power module 2, a circuit substrate 3 formed of a bendable multilayer wiring substrate, a connector member 4 in which a plurality of connectors are integrally collected, and a motor cover 5 attached to one end portion of the motor part 1 so as to cover the inverter power module 2, the circuit substrate 3 and the connector member 4.

The motor part 1 is one in which a motor 1A (FIG. 2) corresponding to an electric actuator composed of a stator 1B and a rotor 1C are accommodated in the inside of a cylindrical housing 7. The motor part 1 includes a connecting portion 6*a*, such as a gear or a spline, at a distal end of a rotation shaft 6 protruding from the distal end surface of the housing 7, so as to be connected to a steering mechanism which is not shown in the drawings via the connecting portion 6*a*. The motor 1A is a three-phase permanent magnet brushless motor, and the stator 1B is provided with a three-phase coil, and permanent magnets are arranged on the outer peripheral surface of the rotor 1C. Here, in order to give redundancy, the motor 1A is provided with two-system coils and corresponding permanent magnets.

One end portion of the housing 7 that is an opposite side to the connecting portion 6*a* is formed as a bottom wall portion 7*a* having a horseshoe-shaped outline such that a part of the outer peripheral edge thereof radially extends, and the motor cover 5 having a horseshoe-shaped outline corresponding to the bottom wall portion 7*a* is attached so as to cover the bottom wall portion 7*a*. Then, the inverter power module 2, the circuit substrate 3 and the connector member 4 are accommodated in the space formed between the bottom wall portion 7*a* and the motor cover 5 so as to be superposed in the axial direction of the rotation shaft 6.

The inverter power module 2 includes two inverter modules 2A for driving the motor 1A, and a relay module 2B that becomes a neutral point relay of the coils, and these are arranged so as to have a substantially U-shape surrounding the rotation shaft 6. Then, these inverter modules 2A and the relay module 2B are fixed to the end surface of the motor part 1 via a pressing member 2C.

The connector member 4 is provided with three connectors directed to the same direction along the axial direction of the rotation shaft 6. Specifically, the connector member 4 is provided with a power source connector 4*a* positioned in the middle, a sensor input connector 4*b* to which signals from sensors (for example, a steering angle sensor, a torque sensor) arranged on the steering mechanism side are input, and a communication connector 4*c* for carrying out the communication (for example, CAN communication) with other control devices inside a vehicle. These connectors 4*a*, 4*b* and 4*c* protrude to the outside through an opening portion 8 of the motor cover 5.

In the electric actuator device in this embodiment, the control device (electronic device) including the inverter power module 2 and the circuit substrate 3 is integrated with the motor part 1, and thereby the size of the whole device can be reduced.

Figure 3:
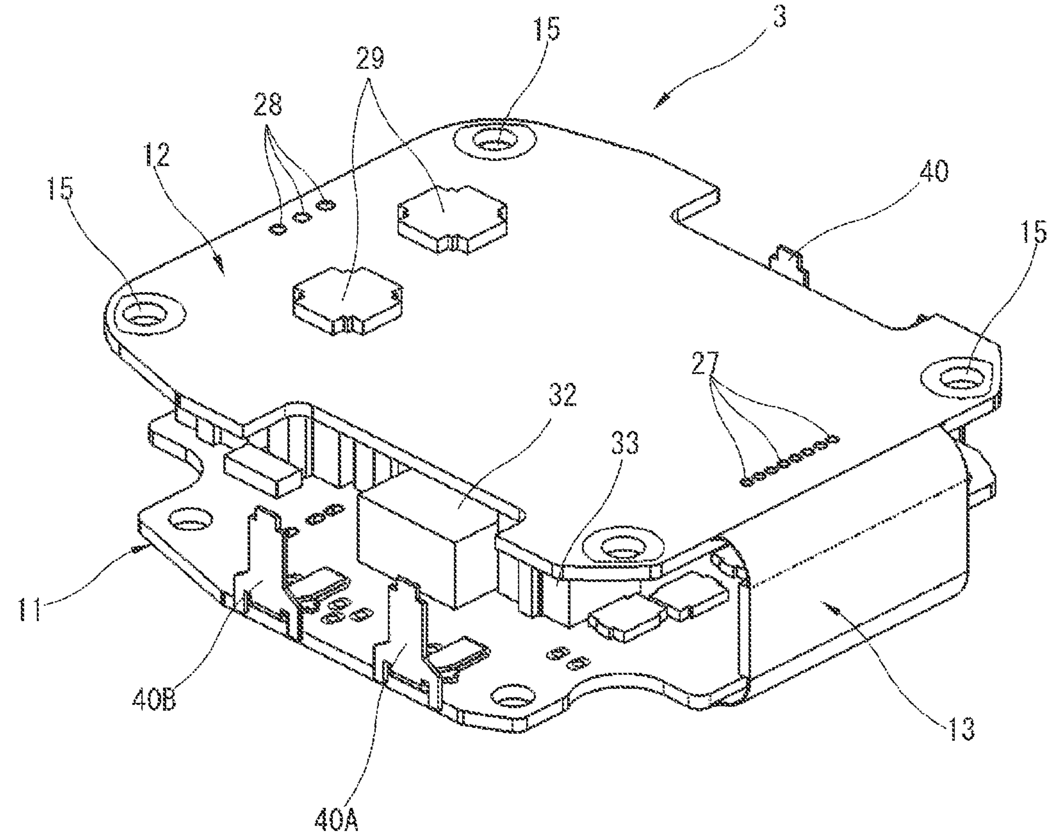
FIG. 3 is a perspective view of the circuit substrate in a bent state.
Figure 4:
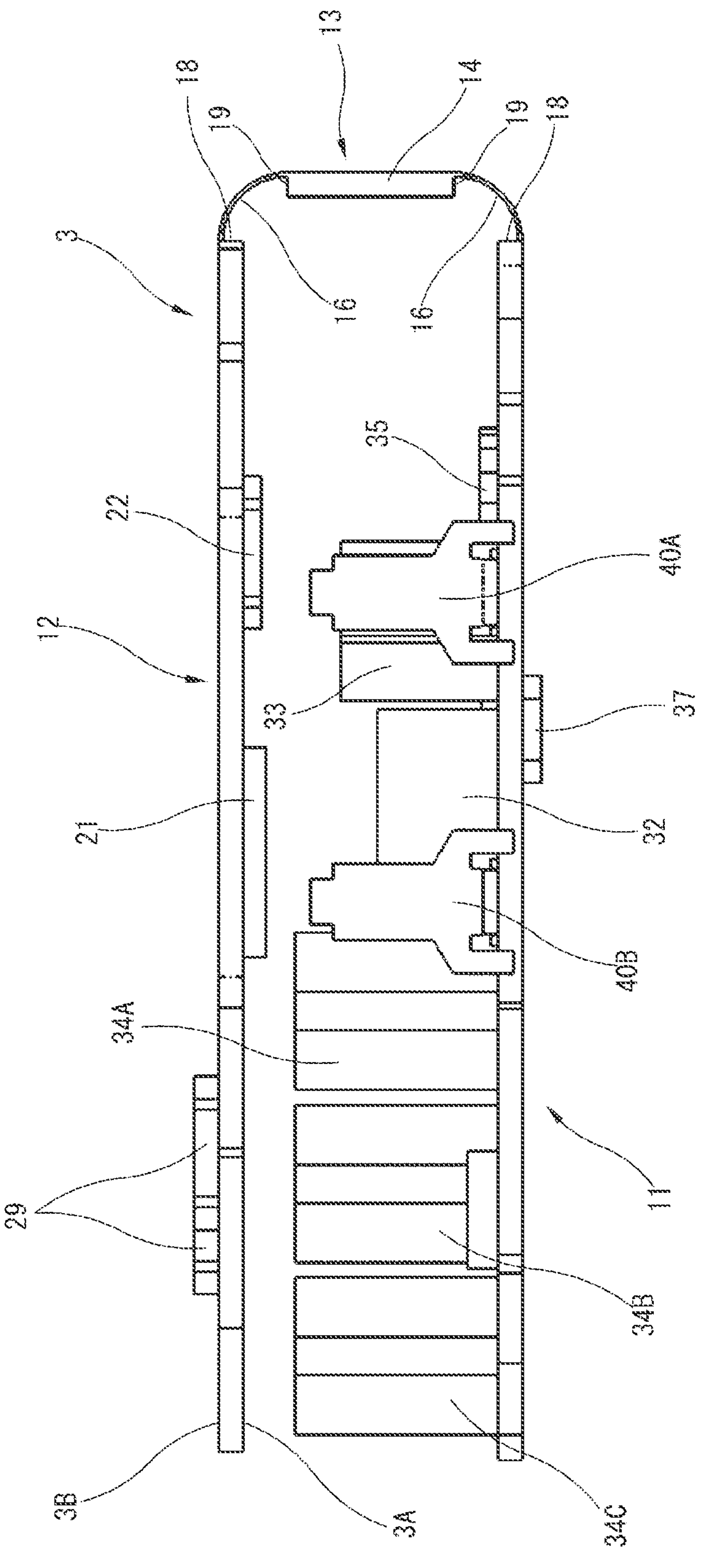
FIG. 4 is a side view of the circuit substrate in a bent state.

FIG. 3 is a perspective view schematically showing the circuit substrate 3 in a state of being bent in a substantially U-shape, and FIG. 4 is a side view. As shown in FIGS. 3 and 4, the circuit substrate 3 is, as mentioned above, incorporated into the electric actuator device in a state of being bent in a substantially U-shape.

That is, the circuit substrate 3 is provided with a first rigid part 11 that is a power source substrate mounting electronic component groups through which a relative large current flows for driving the motor 1A via the inverter power module 2, a second rigid part 12 that is a control substrate mounting control electronic components through which a relatively small current flows, and a flexible part 13 arranged between the first rigid part 11 and the second rigid part 12. The first rigid part 11 and the second rigid part 12 each correspond to a component mounting part. The circuit substrate 3 is accommodated between the motor cover 5 and the housing 7 serving as a case, in a state in which the flexible part 13 is flexibly deformed so as to have a shape in which the first rigid part 11 and the second rigid part 12 are superposed to each other in the axial direction of the rotation shaft 6. Specifically, in an embodiment, the first rigid part 11 and the second rigid part 12 are fixed to and supported by the electric actuator device in a state of being bent so as to be away from each other by a distance in which the electronic components mounted on the first rigid part 11 do not come in contact with the electronic components mounted on the second part 12 and in a state in which they are parallel to each other while keeping a plane state.

Figure 5:
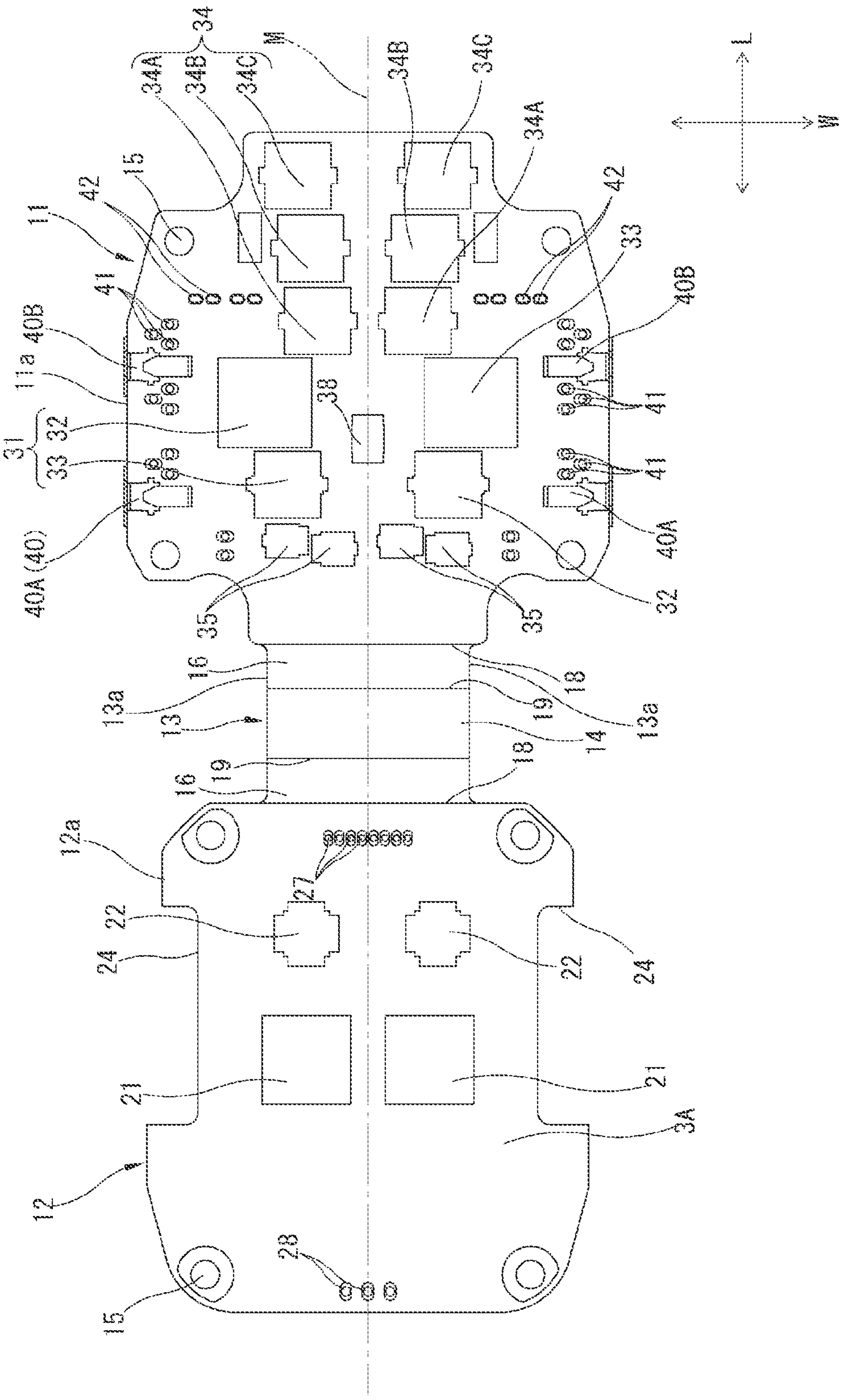
FIG. 5 is a plane view showing a first surface of the circuit substrate in an unfolded state.

The circuit substrate 3 is formed by one multilayer wiring substrate as mentioned below and includes a first surface 3A which is an inner surface in a bent state and a second surface 3B which is an outer surface in a bent state. FIG. 5 is a plane view, and there is shown a configuration of the first surface 3A in a state in which the circuit substrate 3 is unfolded, namely, in a state before being bent. The circuit substrate 3 is formed as one circuit substrate in which, in the unfolded state as shown in FIG. 5, the first rigid part 11, the second rigid part 12 and the flexible part 13 are along one flat plane and is bent in a substantially U-shape in the end after components are mounted thereon.

Each of the first rigid part 11 and the second rigid part 12 has a shape like a square shape, and the four corners of each of the first rigid part 11 and the second rigid part 12 are provided with respective attachment holes 15. In addition, the middle of one side of the first rigid part 11 and the middle of one side of the second rigid part 12 which are adjacent to each other are connected to each other by the belt-shaped flexible part 13 having a fixed width. That is, the width of the flexible part 13 is narrower than the width (dimension in the direction orthogonal to the bending direction) of each of the first rigid part 11 and the second rigid part 12. Therefore, as a whole, the circuit substrate 3 has an I-shape or a shape of 8. In this way, the circuit substrate 3 is configured such that the width of each of the first and second rigid parts 11 and 12 is relatively wide and the width of the flexible part 13 is relatively narrow, and thereby it is possible to ensure a large component mounting area, and the flexible deformation of the flexible part 13 can be easily carried out.

The circuit substrate 3 is formed by a multilayer printed wiring substrate, specifically, a so-called printed wiring substrate having an eight-layer structure having eight metal foil layers. The multilayer printed wiring substrate is formed by laminating, for example, several layers of glass epoxy substrates each having, one or both of the surfaces thereof, a metal foil layer via prepreg (adhesive layer) and being integrated by heating pressurization. Accordingly, eight metal foil layers that become wiring layers are formed which are composed of metal foil layer as a surface layer of each of the first surface 3A and the second surface 3B and six metal foil layers as inner layers. Substrates serving as insulation layers are interposed between the metal foil layers so as to insulate between the metal foil layers. In addition, in the first rigid part 11 and the second rigid part 12, by the etching of the eight metal foil layers and the formation of vias extending in the lamination direction, a desired circuit pattern is formed.

As is clear from FIG. 4, the thickness (dimension in the lamination direction) of the substrate of the flexible part 13 is relatively thin as compared with the thickness of the substrates of the first rigid part 11 and the second rigid part 12 each having an eight-layer structure, and thereby the flexible part 13 has a higher flexibility than that of the first rigid part 11 and the second rigid part 12. In one embodiment, for example, the circuit substrate 3 having a eight-layer structure is formed, for example, in a rectangular shape which includes the first rigid part 11, the second rigid part 12 and the flexible part 13, following which, by secondary machining, six layers positioned on the inner side in the flexible part 13 when being bent are removed so as to be thin. Therefore, the material of each of the substrates of the first and second rigid parts 11 and 12 is the same as that of the substrate of the flexible part 13, and the remaining two metal foil layers as the flexible part 13 are continued over the first and second rigid parts 11 and 12 and the flexible part 13.

In addition, in the illustrated example, a middle rigid part 14 having an eight-layer structure is left in the middle part of the flexible part 13 in order to ensure a printing surface for a bar code and the like, and thin parts, as a pair of recessed grooves 16, are formed on the respective both sides of the middle rigid part 14. This middle rigid part 14 is not always needed, and the whole of the flexible part 13 can be formed thin. In the present embodiment, the whole area between the first rigid part 11 and the second rigid part 12 including the middle rigid part 14 is referred to as a flexible part 13.

As is clear from FIGS. 4 and 5, the recessed grooves 16 are each recessed in a groove shape in the first surface 3A of the circuit substrate 3. In the second surface 3B, the flexible part 13 has a surface continuous with the first and second rigid parts 11 and 12.

The recessed grooves 16 in a pair for giving flexibility required for the flexible part 13 are formed along respective one side of the first rigid part 11 and one side of the second rigid part 12, and, with this, boundaries 18 between the first rigid part 11 and the flexible part 13 and between the second rigid part 12 and the flexible part 13 are defined. In other words, by the edges on the outer sides of the thin recessed grooves 16, a pair of the linear boundaries 18 are defined, and when being bent as shown in FIG. 4, the thin flexible part 13 is flexibly deformed between the pair of the boundaries 18. The width (dimension in the direction orthogonal to the bending direction) of the circuit substrate 3 decreases at the boundaries 18 from the first and second rigid parts 11 and 12 to the flexible part 13. The flexible part 13 is formed in a belt shape having a fixed width so as to be easily and flexibly deformed. In addition, in order to suppress stress concentration due to the decreasing of the width at each of the boundaries 18, at the corners of the both ends of each of the boundaries 18 at which the first and second rigid parts 11 and 12 are connected to the flexible part 13, the flexible part 13 is rounded in an arc shape having an appropriate diameter (see FIG. 5).

In the flexible part 13 (in the recessed grooves 16), of the eight metal foil layers, a surface metal foil layer on the second surface 3B side which is positioned on the outer side when being bent and an inner metal foil layer (that is, a second layer when viewed from the second surface 3B side) adjacent to the surface metal layer are left. In the flexible part 13, only these two metal foil layers are used for forming a wiring pattern. In the first and second rigid parts 11 and 12, further six metal foil layers are used for forming a wiring pattern. In addition, although the middle rigid part 14 has eight metal foil layers, metal foil layers corresponding to a third to eighth layers when viewed from the second surface 3B side are not used for forming a wiring pattern.

Similarly, linear boundaries 19 also exist between a pair of the recessed grooves 16 and the middle rigid part 14. The four boundaries 18 and 19 including the pair of the boundaries 18 and the pair of the boundaries 19 are arranged parallel to each other.

Next, a main configuration of the layout of various components in the circuit substrate 3 will be explained. In addition, in the following, in order to facilitate understanding, the longitudinal direction of the circuit substrate 3 in the unfolded state is referred to as an L direction as shown in FIG. 5, and the width direction orthogonal to the L direction is referred to as a W direction. The pair of the boundaries 18 of the flexible part 13 mentioned above each are a straight line extending in the W direction. If a straight line along the L direction was drawn on the circuit substrate 3 in the unfolded state, in a state in which the circuit substrate 3 was bent in a substantially U-shape, by the straight line on the first rigid part 11 and the straight line on the second rigid part 12, one plane (plane orthogonal to the boundaries 18) would be specified. Moreover, for convenience of explanation, as shown in FIG. 5, a line intersecting the rotation center axis of the motor 1A at the time of the assembling and extending parallel to the L direction is referred to as a substrate center line M.

The circuit substrate 3 in this embodiment is equipped with two control systems independent of each other which correspond to two-system coils of the motor 1A. When failures or errors occur to one of the systems, the drive of the motor 1A can be carried out by the other of them. Basically, each of the control systems is configured such that components are arranged on the circuit substrate 3 along the L direction that is the longitudinal direction, and, basically, the two control systems are configured so as to be arranged side by side in the W direction that is the width direction of the circuit substrate 3. Except the differences in details of parts, the two control systems are configured so as to be symmetrical with respect to the substrate center line M as a center.

As shown in FIG. 5, in the first surface 3A of the first rigid part 11, two filter parts 31 for removing noise are arranged near the center part in the L direction of the first rigid part 11, and two power capacitors 34 are arranged at the positions more on the opposite side of the flexible part 13 than the filter parts 31. That is, one control system includes one filter part 31 and one power capacitor 34. Each of the filter parts 31 is composed of a coil 32 equipped with a rectangular case and a capacitor 33 equipped with a rectangular case at a position closer to the flexible part 13 than to the coil 32. In addition, each of the power capacitors 34 is composed, for example, of three capacitors 34A, 34B, and 34C each equipped with a rectangular case. An electronic component group composing one control system, namely, a capacitor 33, a coil 32 and capacitors 34A, 34B and 34C are arranged in this order, are not arranged in a complete straight line but are arranged substantially in a line in the L direction. Then, a capacitor 33, a coil 32 and capacitors 34A, 34B and 34C composing one of the control systems, and a capacitor 33, a coil 32 and capacitors 34A, 34B and 34C composing the other of them are arranged so as to be symmetrical with respect to the substrate center line M as a center.

In addition, two power cut-off switching elements 35 are mounted between the capacitor 33 of one of the control systems and the flexible part 13 and two power cut-off switching elements 35 are mounted between the capacitor 33 of the other of them and the flexible part 13, and a total of four power cut-off switching elements 35 are mounted. The two power cut-off switching elements 35 of each of the control systems are arranged adjacent to a corresponding one of the capacitors 33. In addition, the four power cut-off switching elements 35 in total are arranged in a substantially straight line along the W direction.

In the first surface 3A of the first rigid part 11, as a detection element for detecting the operation condition of the motor 1A, a second rotation sensor 38 is mounted between the electronic component groups of the two control systems, specifically, between the two filter parts 31. This second rotation sensor 38 is an analog rotation sensor for detecting the rotation of the rotation shaft 6 by being combined with a magnetic pole provided to an end portion of the rotation shaft 6 of the motor 1A and is arranged at a position on the center axis line of the rotation shaft 6 at the time when being assembled. This second rotation sensor 38 is one shared by the two control systems, and the detection signal thereof is branched into two signal circuits on the first rigid part 11 so as to be used in the respective control systems.

Power source terminals 40 are attached to a pair of respective side edge portions 11*a* directed in the W direction of the first rigid part 11. Each of the power source terminals 40 includes a positive terminal 40A and a negative terminal 40B, and one set of a power source terminal 40 composed of a first terminal 40A and a negative terminal 40B corresponds to one of each of the control systems. The power source terminals 40 are positioned more on the outer side than the electronic component groups (namely, capacitors 33, coils 32, and capacitors 34A, 34B and 34C) composing the respective control systems, in the W direction.

The positive terminals 40A and the negative terminals 40B are each made from a metal piece bent in a substantially L-shape and are provided along the side edges of the first rigid part 11 so as to stand orthogonal to the first surface 3A from the first surface 3A. The positive terminals 40A and the negative terminals 40B are arranged along the L direction, and the positive terminals 40A are positioned closer to the flexible part 13 than to the negative terminals 40B. Specifically, each of the positive terminals 40A is positioned on the side of a corresponding one of the capacitors 33 of the filter parts 31, and each of the negative terminals 40B is positioned on the side of a corresponding one of the coils 32 of the filter parts 31. In a final assembled state as an electric actuator device, the power source terminals 40 are connected to respective terminal pieces of the power source connector 4*a* of the connector member 4 mentioned above. In addition, two sets of the power source terminals 40 are configured so as to be symmetrical to each other with respect to the substrate center line M as a center. Here, the positive terminals 40A of the power source terminals 40 correspond to “power source input terminal” in the claims.

The first rigid part 11 is further provided with gate signal ports 41 connected to switching elements of respective arms of the inverter power module 2, and inverter power source ports 42 for supplying power source voltage to the inverter power module 2. Each of these ports is formed as a terminal having a through whole shape. The gate signal ports 41 are arranged adjacent to the first power source terminals 40, and the inverter power source ports 42 are arranged on the sides (outer sides in the W direction) of the power capacitors 34. In a final assembled state as an electric actuator device, pin-shaped terminal pieces of the inverter power module 2 are inserted into and electrically connected to these ports 41, 42.

In the first surface 3A of the second rigid part 12, two CPUs 21 corresponding to the respective two control systems are mounted near the center part in the L direction of the second rigid part 12. Each of the CPUs 21 is composed of an integrated circuit including a substantially square flat package. The two CPUs 21 are arranged symmetrically with respect to the substrate center line M as a center. Pre-driver circuit elements 22 are mounted at positions closer to the flexible part 13 than to the two CPUs 21. Each of the pre-driver circuit elements 22 is composed of an integrated circuit including a substantially square flat package smaller than each of the CPUs 21. The two pre-driver circuit elements 22 correspond to the respective two control systems and are arranged symmetrically with respect to the substrate center line M as a center. Each of the pre-driver circuit elements 22 is arranged with a corresponding one of the CPUs 21 of the control systems along the L direction.

Cutout parts 24 for avoiding interference with the above-mentioned power source terminals 40 of the first rigid part 11 in a bent state are formed at a pair of respective side edge parts 12*a* directed in the width direction of the second rigid part 12. These cutout parts 24 are positioned at substantially the sides of the pre-driver circuit elements 22 and the CPUs 21.

An external sensor input parts 27 formed by a plurality of through-hole-shaped terminals are provided in an end part region close to the flexible part 13 of the second rigid part 12. The plurality of the through-hole-shaped terminals are arranged on a straight line along the W direction. In a final assembled state as an electric actuator device, the pin-shaped terminal pieces of the sensor input connector 4*b* of the connector member 4 are inserted into the external sensor input part 27, such that signals of external sensors, such as a steering angle sensor and a torque sensor, are input to each of the control systems via the external sensor input part 27.

In addition, a communication ports 28 formed by a plurality of through-hole-shaped terminals are provided in an end part region on the opposite side of the flexible part 13 in the second rigid part 12. The plurality of the through-hole-shaped terminals are arranged on a straight line along the W direction. In a final assembled state as an electric actuator device, the pin-shaped terminal pieces of the communication connector 4*c* of the connector member 4 are inserted into the communication port 28, so as to communicate with other external control apparatuses.

As shown in FIG. 4, in the second surface 3B of the first rigid part 11, a first rotation sensor 37 as a detection element for detecting the operation condition of the motor 1A is mounted in the middle part thereof. This first rotation sensor 37 is a digital rotation sensor for detecting the rotation of the rotation shaft 6 by being combined with a magnetic pole provided to an end portion of the rotation shaft 6 of the motor 1A and is arranged at a position on the center axis line of the rotation shaft 6 at the time when being assembled. Similar to the second rotation sensor 38, this first rotation sensor 37 is one shared by the two control systems, and the detection signal thereof is branched into two signal circuits on the first rigid part 11 so as to be used in the respective control systems.

The first rotation sensor 37 disposed on the second surface 3B and the second rotation sensor 38 disposed on the first surface 3A are arranged at positions at which the first rotation sensor 37 and the second rotation sensor 38 are superimposed on each other when the circuit substrate 3 is projected. In a final assembled state as an electric actuator device, the first rotation sensor 37 is positioned on the outer side surface of the circuit substrate 3 having a substantially U-shape, so as to face an end surface of the rotation shaft 6. The second rotation sensor 38 is positioned on the inner side of the circuit substrate 3 having a substantially U-shape. In one embodiment, the first rotation sensor 37 is a main rotation sensor, and the second rotation sensor 38 is an auxiliary rotation sensor used when, for example, the first rotation sensor 37 is abnormal.

In addition, one of the rotation sensors respectively disposed on the first surface 3A and the second surface 3B may be used for one of the control systems, and the other of them may be used for the other of the control systems, so as to be used independently of one another.

As shown in FIGS. 3 and 4, in the second surface 3B of the second rigid part 12, two power source communication ICs 29 each composed of an integrated circuit including a power source circuit for the second rigid part 12 and a communication circuit for the communication port 28 are mounted thereon. Each of the power source communication ICs 29 has a substantially square flat package having a size smaller than that of each of the CPUs 21. The two power source communication ICs 29 correspond to the respective two control systems and are arranged at positions substantially symmetrical with respect to the substrate center line M as a center.

The power source communications ICs 29 communicate with other external control apparatuses via the communication port 28 and convert terminal voltage supplied from the power source terminal 40 to the second rigid part 12 side into operation voltage for the second rigid part 12. In addition, the power source circuit and the communication circuit may be composed by respective individual integrated circuits.

As the above, although the arrangement of the main electronic components has been explained, in addition to the above electronic components, a plurality of relatively small electronic components which are not shown are surface-mounted on the first rigid part 11 and the second rigid part 12.

The detection signals of the first rotation sensor 37 and the second rotation sensor 38 disposed on the first rigid part 11 are sent to the second rigid part 12 side equipped with the CPUs 21 via a wiring (sensor signal wiring) linearly provided to the flexible part 13.

In the circuit substrate 3 in one embodiment, two-system control systems corresponding to respective two-system coils of the motor 1A are configured so as to be independent of each other, and these two control systems are arranged so as to be substantially symmetrical with respect to the substrate center line M as a center which extends across the first and second rotation sensors 37 and 38. One control system will be explained. The detection signals of the first and second rotation sensors 37 and 38 which respond to the rotation of the motor 1A are sent from the first rigid part 11 to the second rigid part 12 via sensor signal wirings in the flexible part 13. A CPU 21 of the second rigid part 12 performs operation processing using the detection signals as one parameter, calculates the operation amount for the motor 1A and generates an instruction signal based on the calculated operation amount. The instruction signal is amplified by a pre-driver circuit element 22 and is converted into a control signal for an inverter circuit. This control signal is sent from the second rigid part 12 to the first rigid part 11 via wirings (drive signal wirings) arranged in straight lines on the flexible part 13, and in the end, as a gate signal, it is output from gate signal ports 41 of the first rigid part 11 to the inverter power module 2. The inverter power module 2 is supplied with power source voltage from a first power source terminal 40 of the first rigid part 11 via power cut-off switching elements 35, a filter part 31, a power capacitor 34 and inverter power source ports 42, and by inverter action based on the gate signal, the motor 1A is driven.

A plurality of sensor signal wirings and a plurality of high voltage gate signal wirings are formed in straight lines along the L direction so as to be parallel to each other. The sensor signal wirings are part of a plurality of low voltage signal wirings for transmitting receiving signals between the first rigid part 11 and the second rigid part 12. A gate signal having a relatively high voltage flows through the high voltage gate signal wirings. As wirings extending between the first rigid part 11 and the second rigid part 12 in the flexible part 13, a power source positive electrode wiring for supplying power source voltage input to the positive electrodes 40A toward the second rigid part 12, a control circuit ground wiring and an inverter circuit ground wiring are included. These wirings are each formed in a straight line so as to be parallel to each other in the flexible part 13.

In the flexible part 13, a plurality of signal wirings are arranged on a metal foil layer which becomes a surface layer or an inner layer and extend parallel to each other, and thereby a plurality of wirings can be wired in a simplified form on the flexible part 13 having a limited width. Then, a ground wiring having a relatively wide width can be provided on a metal foil layer that becomes a surface layer or an inner layer.

In addition, as ground wirings, a control circuit ground wiring for a control system circuit such as a CPU 21 which operates with a relatively low voltage and an inverter circuit ground wiring for an inverter circuit which operates with a relatively high voltage are provided independently of each other. Since they are provided separately from each other, effect on potential of the control circuit ground wiring due to a gate signal is suppressed, and the potential of the control circuit ground wing is stabilized. These ground wirings are, in the end, connected to each other via a shunt resistor which is not shown and are conducted to a negative electrode terminal 40B.

Next, a few embodiments of a layout of a power source positive electrode wiring, a signal wiring and a ground wiring in the flexible part 13 which is a main part of the present invention will be explained. In the following explanation and the drawings from FIG. 6, a power source positive electrode wiring is represented by a symbol of "BA", and when there are a plurality of the power source positive electrode wirings, symbols of "BA1, BA2 . . . " are used. Similarly, a low voltage signal wiring including a sensor signal is represented by symbols of "LV, LV1, LV2 . . . ", a high voltage gate signal wiring is represented by symbols of "HV, HV1, HV2 . . . ", a control circuit ground wiring is represented by symbols of "GC, GC1, GC2 . . . ", and an inverter circuit ground wiring is represented by symbols of "GI, GI1, GI2 . . . ".

Figure 6:
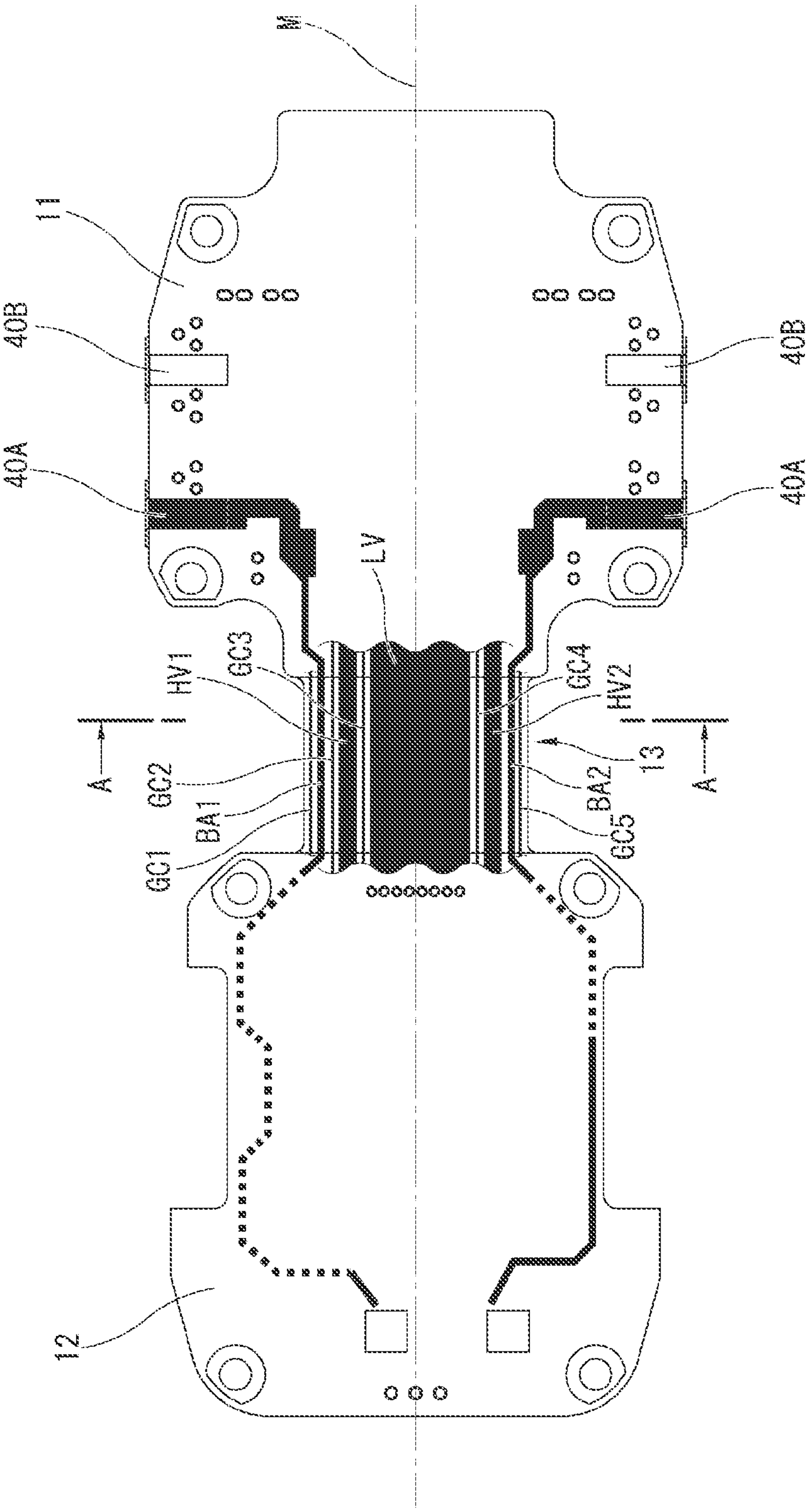
FIG. 6 is an illustrative view of a wiring layout of a first layer in a flexible part in a first embodiment.
Figure 7:
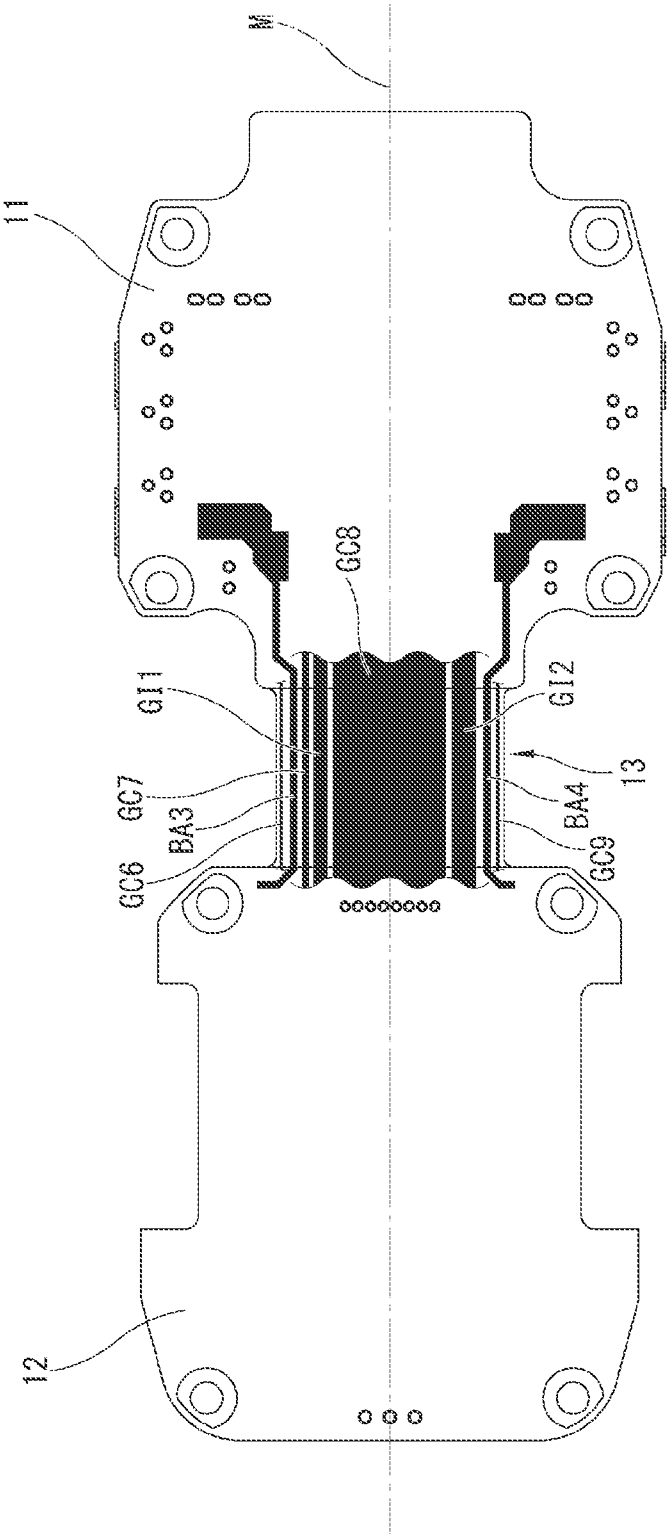
FIG. 7 is an illustrative view of a wiring layout of a second layer in the flexible part in the first embodiment.
Figure 8:
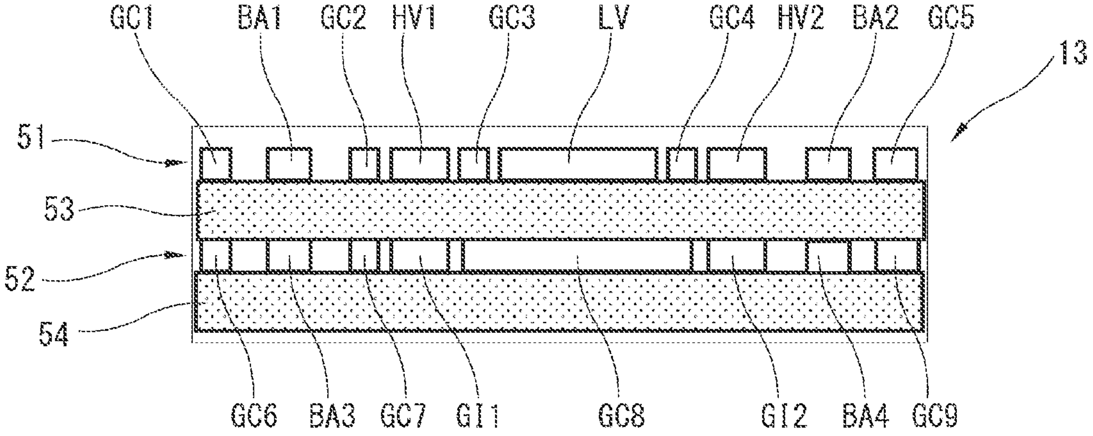
FIG. 8 is an illustrative view of the cross section along an A-A line in FIG. 6.

FIG. 6 is an illustrative view of a wiring layout of a first layer in the flexible part 13 in a first embodiment, and FIG. 7 is an illustrative view of a wiring layout of a second layer. FIG. 8 is an illustrative view of a cross section along an A-A line in FIG. 6. These drawings are illustrative views for explaining wiring layouts of the power source positive electrode wiring BA and the like, and the dimension and the like are not necessarily accurate, and, in order to facilitate understanding, they are shown by being exaggerated or simplified. As shown in the sectional view of FIG. 8, in the flexible part 13, a metal foil layer 51 of the first layer that is a surface layer and a metal foil layer 52 of the second layer that is an inner layer are laminated with insulating substrates 53 and 54. FIGS. 6 and 7 respectively show a wiring pattern formed on the metal foil layer 51 of the first layer and a wiring pattern formed on the metal foil layer 52 of the second layer.

In each embodiment of the present invention, a power source input terminal, namely, a positive terminal 40A is provided to only the first rigid part 11 of the two rigid parts 11 and 12, and the second rigid part 12 is not equipped with a power source input terminal in order to ensure a larger component mounting area of the second rigid part 12. Therefore, power supply to the second rigid part 12 is carried out via the power source positive electrode wiring BA. That is, the power source positive electrode wiring BA extending from the positive electrode terminal 40A of the first rigid part 11 to a power source communication IC 29 extends passing through the flexible part 13.

In the first embodiment, two power source positive electrode wirings BA1 and BA2 are provided on the first layer (FIG. 6), and two power source positive electrode wirings BA3 and BA4 are provided on the second layer (FIG. 7). In the flexible part 13, each of the first layer and the second layer has control circuit ground wirings GC (GC1, GC5, GC6, GC9) at the outermost edges, and the power source positive electrode wirings BA (BA1-BA4) are positioned on the inner sides of the control circuit ground wirings GC so as to be adjacent to the control circuit ground wirings GC respectively. When being projected along the lamination direction of the circuit substrate 3, as shown in FIG. 8, the power source positive electrode wirings BA1 and BA2 of the first layer and the power source positive electrode wirings BA3 and BA4 of the second layer are positioned such that, in width, the power source positive electrode wirings BA1 and BA2 are at least partially superimposed on the power source positive electrode wirings BA3 and BA4 respectively. In the illustrated example, large parts in width of the wirings are superimposed on each other. In addition, in the following explanation, the word of "superimpose on each other" or "superimpose" represents a state of being only partially superimposed, a state of being completely superimposed or a state of being superimposed such that one covers the other.

In the first layer, a low voltage signal wiring LV is positioned at the middle in the width direction of the flexible part 13, high voltage gate signal wirings HV1 and HV2 are positioned on the respective both sides of the low voltage signal wiring LV via control circuit ground wirings GC3 and GC4. A control circuit ground wiring GC2 is positioned between one high voltage gate signal wiring HV1 and the power source positive wiring BA1.

In the second layer, a wide control circuit ground wiring GC8 is positioned at the middle, and inverter circuit ground wirings GI1 and GI2 are positioned at the respective both sides of the control circuit ground wiring GC8. A control circuit ground wiring GC7 is positioned between one inverter circuit ground wiring GI1 and the power source positive electrode wiring BA3.

As mentioned above, although the circuit substrate 3 is configured including two control systems for redundancy, two power source positive electrode wirings BA1 and BA3 which are superimposed on each other in the lamination direction in the flexible part 13 is included in one of the control systems, and the other two power source positive electrode wirings BA2 and BA4 are included in the other of the control systems. The two power source electrode wirings BA included in each of the control systems are connected to each other so as to be one wiring in the second rigid part 12, and, as shown in a broken line in FIG. 6, it extends to a corresponding one of the power source communication ICs 29 via an inner layer pattern of the second rigid part 12.

In this way, in each of the control systems, by configuring the power source positive electrode wiring BA to be two wirings in the flexible part 13, a relatively large current can be supplied, the width of each of the wirings can be made thin, and by this, the wiring density in the flexible part 13 can be increased. In addition, in the flexible part 13, although problems such as cracks of the substrates 53 and 54 and disconnection of a wiring due to the cracks easily arise, by configuring the power source positive electrode wiring BA to be two wirings in each of the systems, even if one of the wirings are disconnected, a certain amount of current can be ensured by the other power source positive electrode wiring BA.

In the first embodiment, two power source electrode wirings BA are superimposed in the lamination direction of the circuit substrate 3. In other words, each of the power source positive electrode wirings BA is not superimposed on other signal wirings (low voltage signal wiring LV and high voltage gate signal wirings HV). Consequently, effect of noise on the signal wirings is small. In the first embodiment, in particular, since the low voltage signal wiring LV which is easily affected by noise is located at a position superimposed on the control circuit ground wiring GC, it is advantageous to noise suppression.

In addition, although the low voltage signal wiring LV and the high voltage gate signal wirings HV are each drawn as one wiring having a wide width in the drawings, in reality, each of them is a wiring group including a plurality of signal wirings.

In addition, in the first embodiment, in each of the first layer and the second layer, the power source positive electrode wirings BA are not adjacent to the low voltage signal wiring LV. Therefore effect of noise on the low voltage signal wiring LV is small.

In addition, as for the power source positive electrode wirings BA1 and BA3, each of these power source positive electrode wirings BA1 and BA3 is positioned between two control circuit ground wirings GC (GC1, GC2, GC6, GC7) in the same layer. Therefore, it is advantageous to noise suppression.

In addition, as for the power source positive electrode wiring BA2, the power source positive electrode wiring BA2 is positioned between the high voltage gate signal wiring HV (HV2) and the control circuit ground wiring GC (GC5) in the same layer.

In addition, as for the power source positive electrode wiring BA4, the power source positive electrode wiring BA4 is positioned between the control circuit ground wiring GC (GC9) and the inverter circuit ground wiring GI (GI2) in the same layer.

In addition, as for the power source positive electrode wirings BA2 and BA4, when the flexible part 13 is projected along the lamination direction of the circuit substrate 3, in positional relationship in the width direction of the flexible part 13, the high voltage gate signal wiring HV2 and the inverter circuit ground wiring GI2 are respectively positioned on the inner sides of the power source positive electrode wirings BA2 and BA4, and the low voltage signal wiring LV and the control circuit ground wiring GC8 are respectively positioned on the inner sides of the high voltage gate signal wiring HV2 and the inverter circuit ground wiring GI2.

Figure 9:
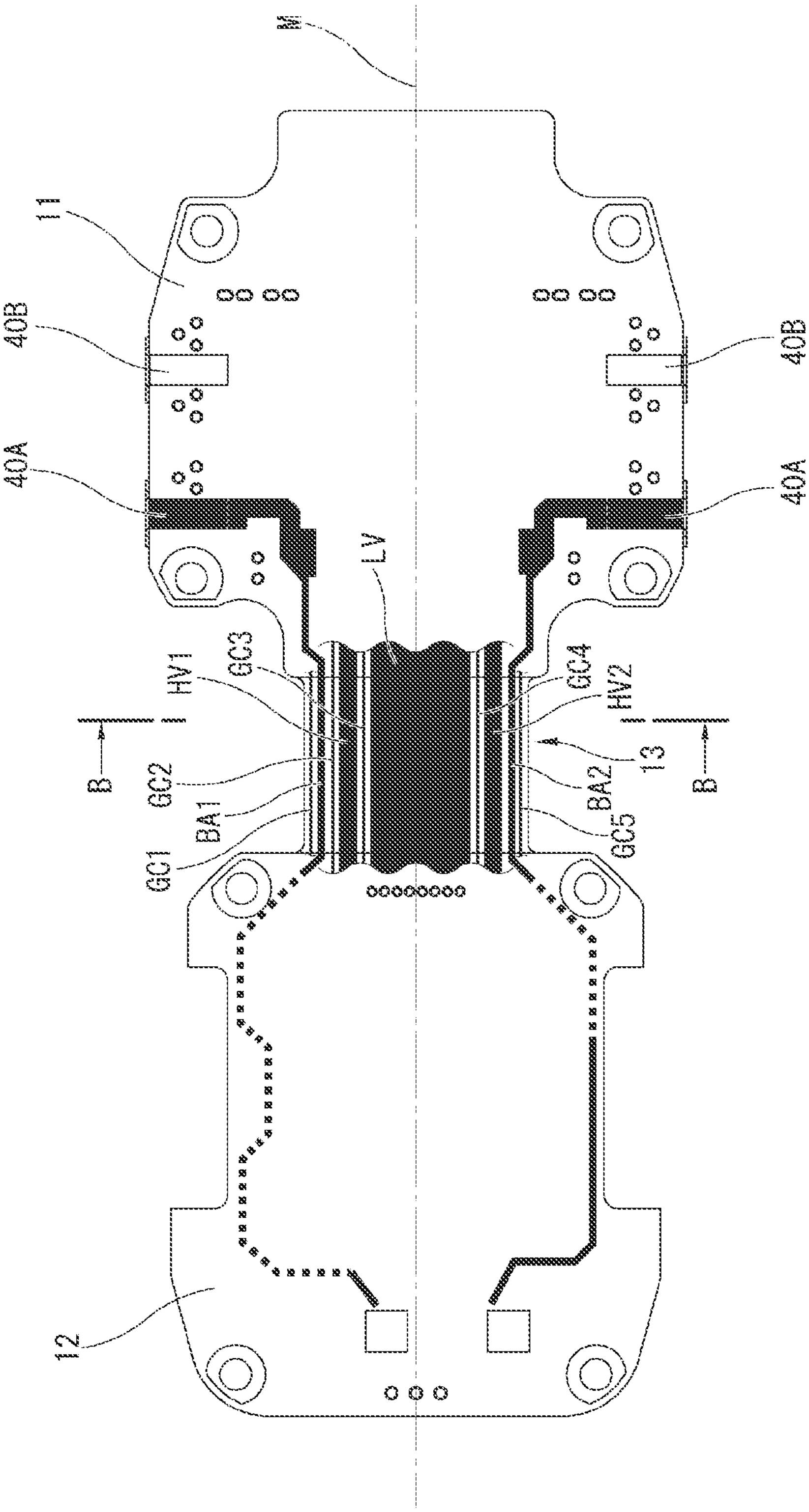
FIG. 9 is an illustrative view of a wiring layout of a first layer in the flexible part in a second embodiment.
Figure 10:
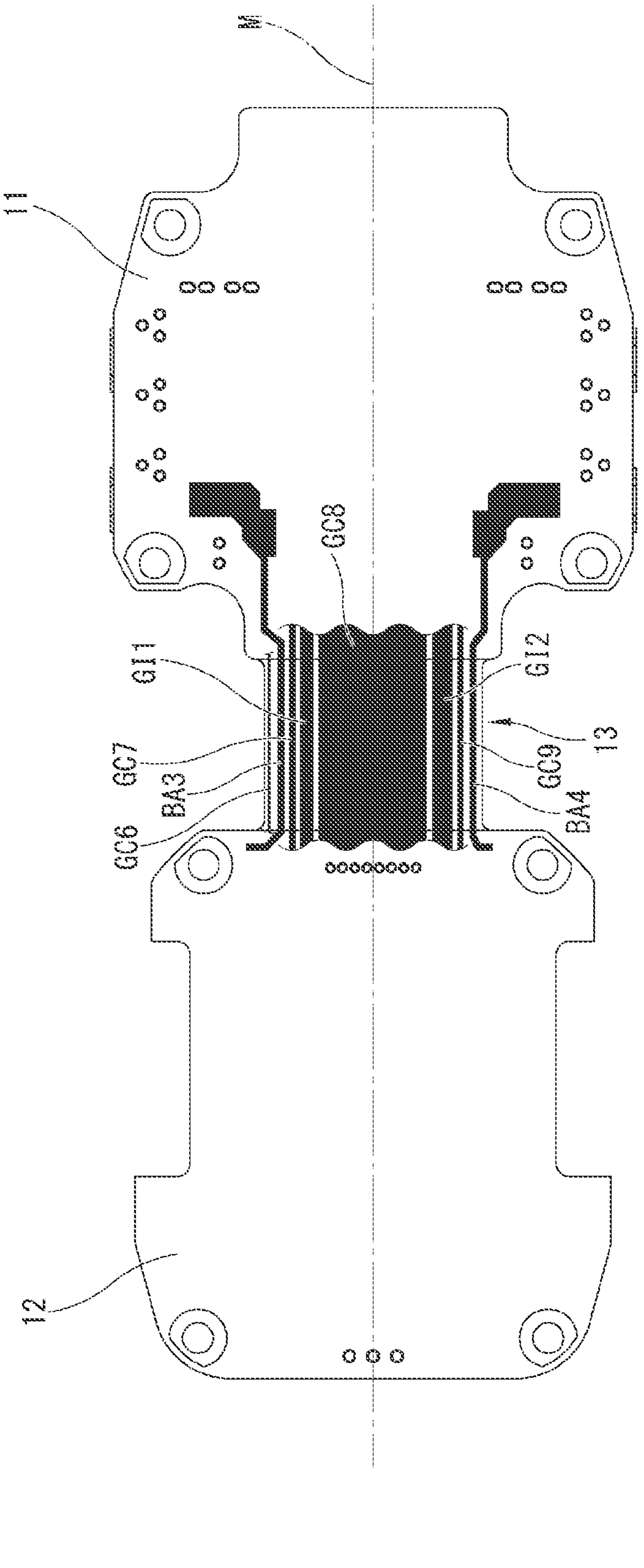
FIG. 10 is an illustrative view of a wiring layout of a second layer in the flexible part in the second embodiment.
Figure 11:
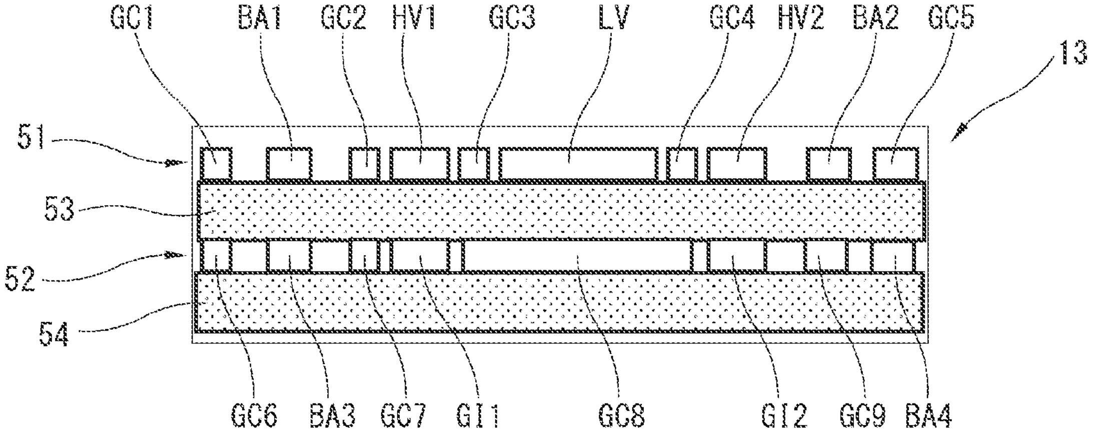
FIG. 11 is an illustrative view of the cross section along a B-B line in FIG. 9.

Next, a wiring layout of a second embodiment will be explained by referencing FIGS. 9 to 11. FIG. 9 is an illustrative view of a wiring layout of the first layer in the flexible part 13 in the second embodiment, and FIG. 10 is an illustrative view of a wiring layout of the second layer. FIG. 11 is an illustrative view of the cross section along a B-B line in FIG. 9.

In the second embodiment, as can be easily understood from FIG. 11, the position of the power source positive electrode wiring BA4 and the position of the control circuit ground wiring GC9 of the second layer in the first embodiment are exchanged with each other. That is, in the second layer, the power source positive electrode wiring BA4 is positioned on the outermost edge of the flexible part 13, and the control circuit ground wiring GC9 is positioned on the inner side of the power source positive electrode wiring BA4 so as to be adjacent thereto. Then, the control circuit ground wiring GC9 is superimposed on the power source positive electrode wiring BA2 of the first layer in the lamination direction of the circuit substrate 3.

Therefore, in the second embodiment, the four power source positive wirings BA are also not superimposed on other signal wirings (low voltage signal wiring LV and high voltage gate signal wirings HV). Consequently, effect of noise on the signal wirings is small.

Figure 12:
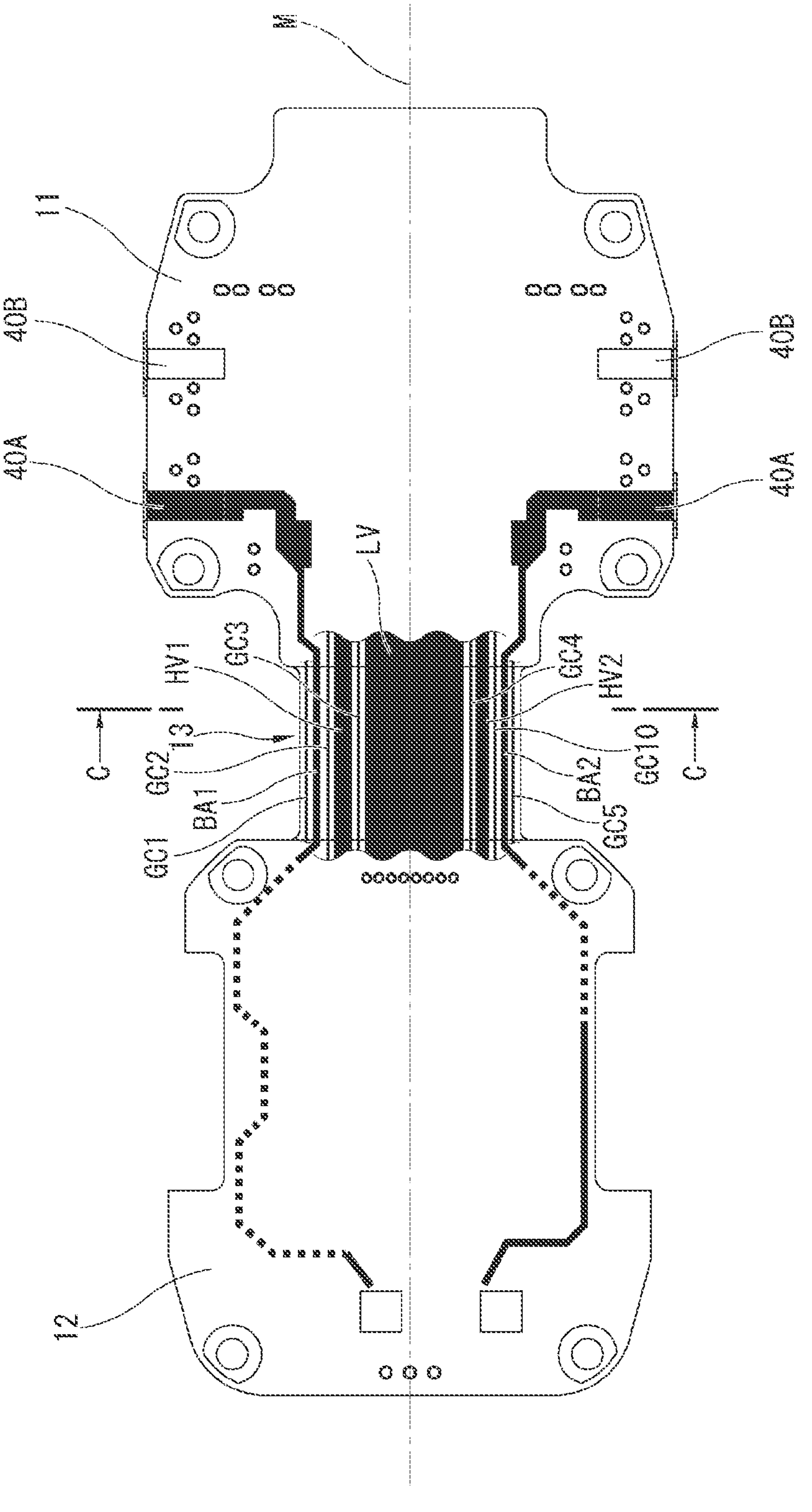
FIG. 12 is an illustrative view of a wiring layout of a first layer in the flexible part in a third embodiment.
Figure 13:
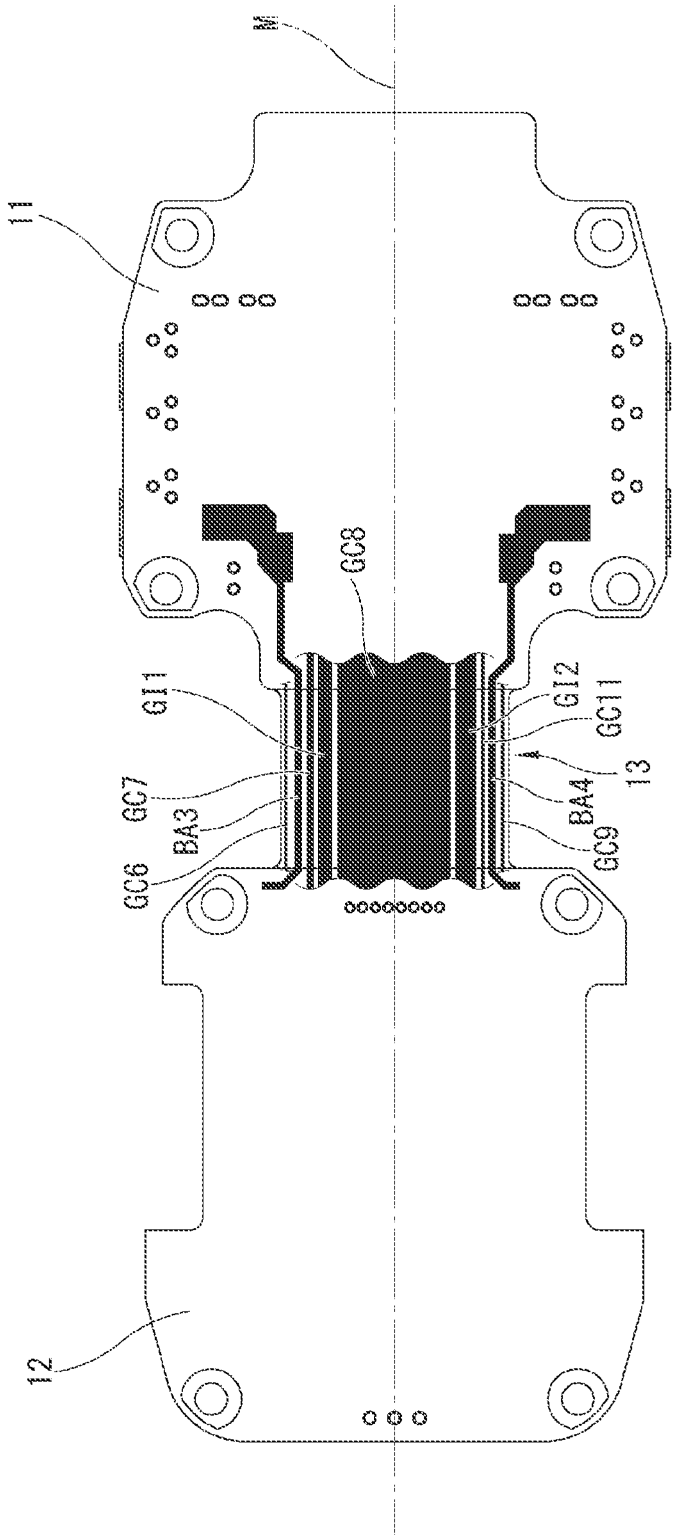
FIG. 13 is an illustrative view of a wiring layout of a second layer in the flexible part in the third embodiment.
Figure 14:
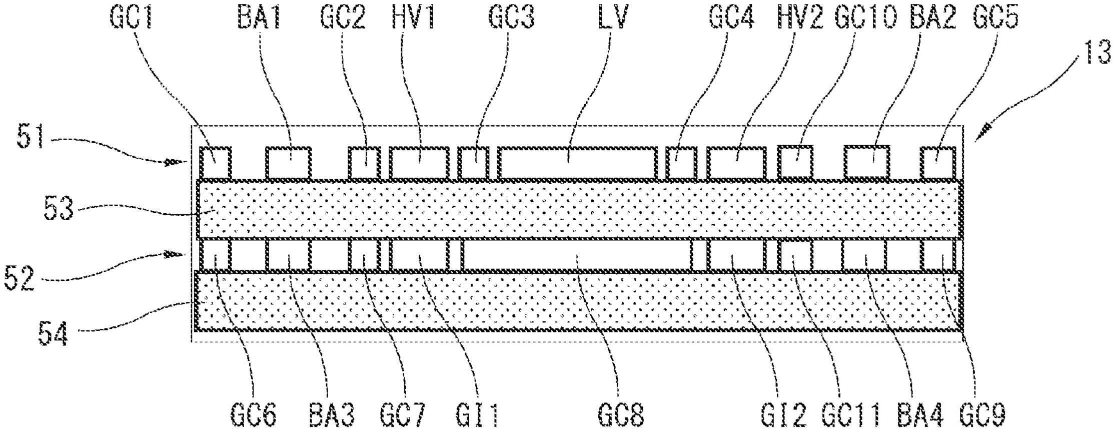
FIG. 14 is an illustrative view of the cross section along a C-C line in FIG. 12.

Next, a wiring layout of a third embodiment will be explained by referencing FIGS. 12 to 14. FIG. 12 is an illustrative view of a wiring layout of the first layer in the flexible part 13 in the third embodiment, and FIG. 13 is an illustrative view of a wiring layout of the second layer. FIG. 14 is an illustrative view of the cross section along a C-C line in FIG. 12.

In the third embodiment, as can be easily understood from FIG. 14, as compared to the configuration of the first embodiment, a control circuit ground wiring GC10 is provided between the high voltage gate signal wiring HV2 and the power source positive electrode wiring BA2 in the first layer, and a control circuit ground wiring GC11 is provided between the inverter circuit ground wiring GI2 and the power source positive electrode wiring BA4 in the second layer. That is, a control circuit ground wiring GC is positioned on each of the both sides of the four power source positive electrode wirings BA. In other words, the power source positive electrode wirings BA and the low voltage signal wiring LV causing noise are not adjacent to each other. In addition, each of the power source positive electrode wirings BA may be provided adjacent to a high voltage gate signal wiring HV.

In addition, as positional relationship in the width direction of the whole flexible part 13 together with the first layer and the second layer, the power source positive electrode wirings BA are positioned relatively close to the outer edges of the flexible part 13, the low voltage signal wiring LV and the control circuit ground wiring GC (GC8) which are superimposed on each other in the lamination direction are positioned in the middle of the flexible part 13, and the high voltage gate signal wirings HV and the inverter circuit ground wirings GI which are superimposed on each other are position between the power source positive electrode wirings BA and the low voltage signal wiring LV and the control circuit ground wiring GC (GC8). That is, from the outside, "power source electrode wirings BA", "high voltage gate signal wiring HV1+inverter circuit ground wirings GI" and "low voltage signal wiring LV+control circuit ground wiring GC" are arrange in this order. By this arrangement, effect on the low voltage signal wiring LV due to the current flowing the power source positive electrode wirings BA becomes small.

Figure 15:
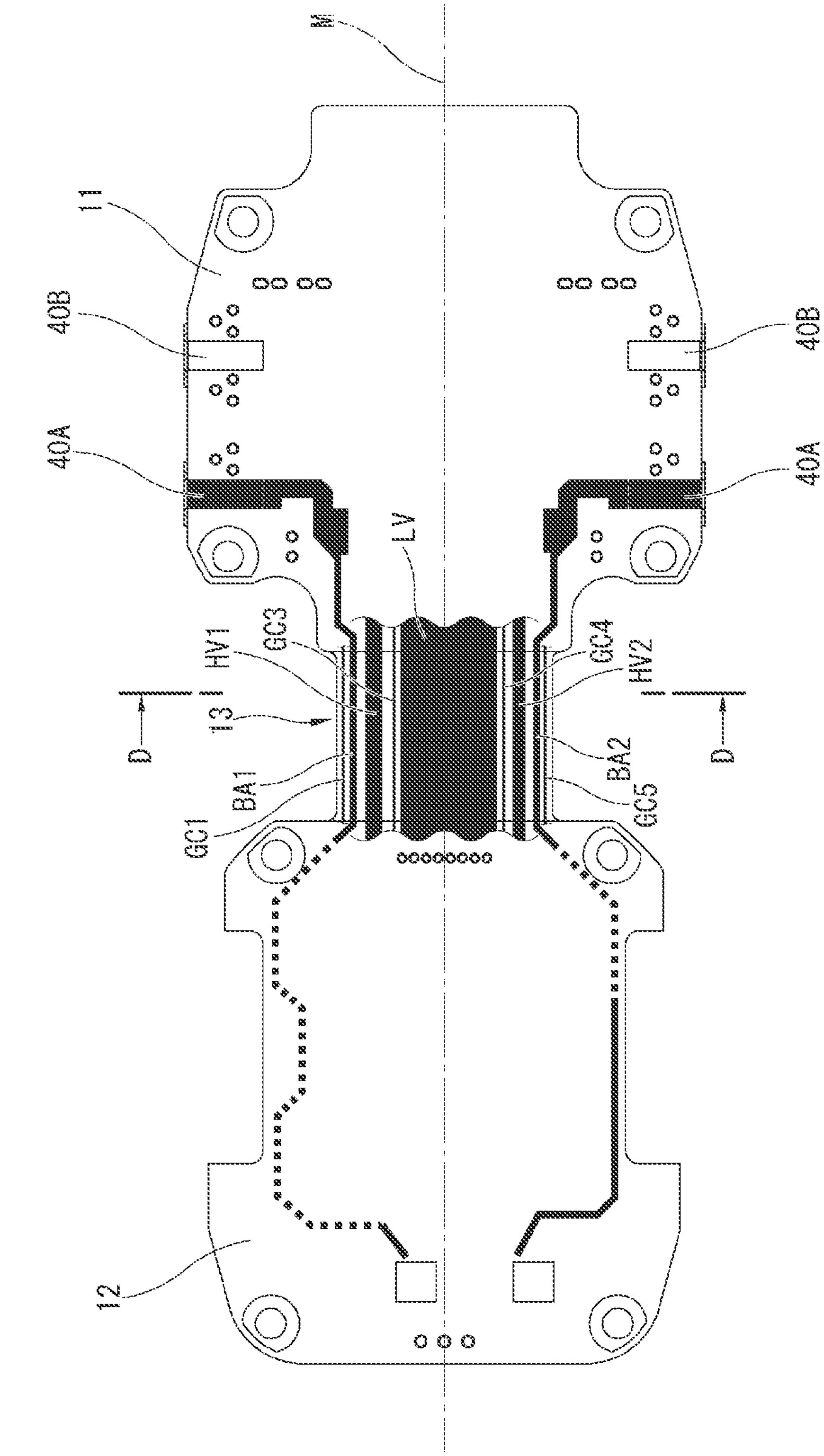
FIG. 15 is an illustrative view of a wiring layout of a first layer in the flexible part in a fourth embodiment.
Figure 16:
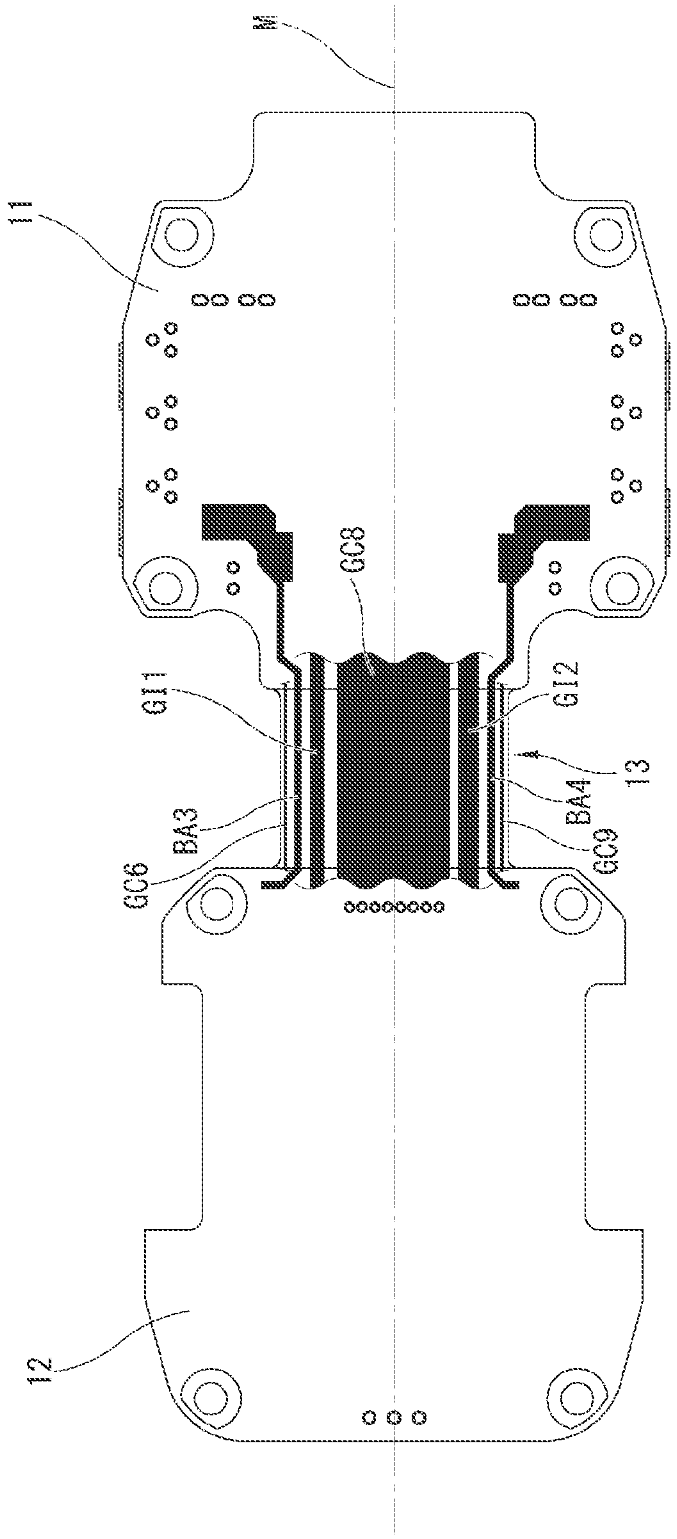
FIG. 16 is an illustrative view of a wiring layout of a second layer in the flexible part in the fourth embodiment.
Figure 17:
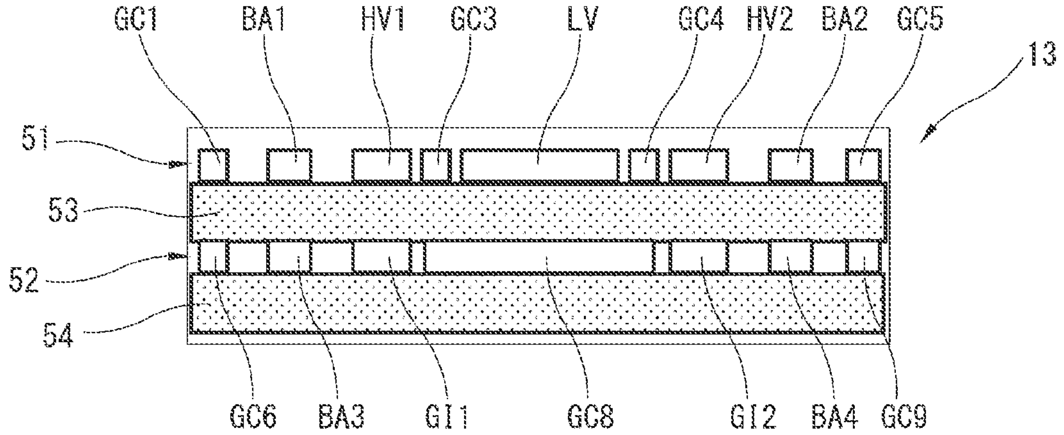
FIG. 17 is an illustrative view of the cross section along a D-D line in FIG. 15.

Next, a wiring layout of a fourth embodiment will be explained by referencing FIGS. 15 to 17. FIG. 15 is an illustrative view of a wiring layout of the first layer in the flexible part 13 in the fourth embodiment, and FIG. 16 is an illustrative view of a wiring layout of the second layer. FIG. 17 is an illustrative view of the cross section along a D-D line in FIG. 15.

In the fourth embodiment, in the first layer, the power source positive electrode wiring BA1 is positioned between the control circuit ground wiring GC1 positioned on the outermost edge and the high voltage gate signal wiring HV1 positioned on the inner side, and the power source positive electrode wiring BA2 is positioned between the control circuit ground wiring GC5 positioned on the outermost edge and the high voltage gate signal wiring HV2 positioned on the inner side. That is, the power source positive electrode wirings BA1 and BA2 are not positioned adjacent to the low voltage signal wiring LV in the same layer.

In addition, in the second layer, the power source positive electrode wiring BA3 is positioned between the control circuit ground wiring GC6 positioned on the outermost edge and the inverter circuit ground wiring GI1 positioned on the inner side, and the power source positive electrode wiring BA4 is positioned between the control circuit ground wiring GC9 positioned on the outermost edge and the inverter circuit ground wiring GI2 positioned on the inner side. That is, similarly, in the second layer, the power source positive electrode wirings BA3 and BA4 are not positioned adjacent to the low voltage signal wiring LV.

Therefore, effect of noise to the low voltage signal wiring LV caused by the power source positive electrode wirings BA is small.

In addition, in this embodiment, the wirings in the flexible part 13 are arranged so as to be basically symmetrical to each other with the substrate center line M therebetween, and the wirings on one side are provided for one of the control systems and the wirings on the other side are provided for the other of the control systems.

In the second layer, the power source positive electrode wiring BA3 is positioned between the control circuit ground wiring GC6 and the inverter circuit ground wiring GI1 belonging to the same control system, and, similarly, the power source positive electrode wiring BA3 is positioned between the control circuit ground wiring GC9 and the inverter circuit ground wiring GI2 belonging to the same control system.

Similar to the first embodiment and the like, two power source positive electrode wirings BA belonging to the same system are superimposed on each other in the lamination direction of the circuit substrate 3.

Figure 18:
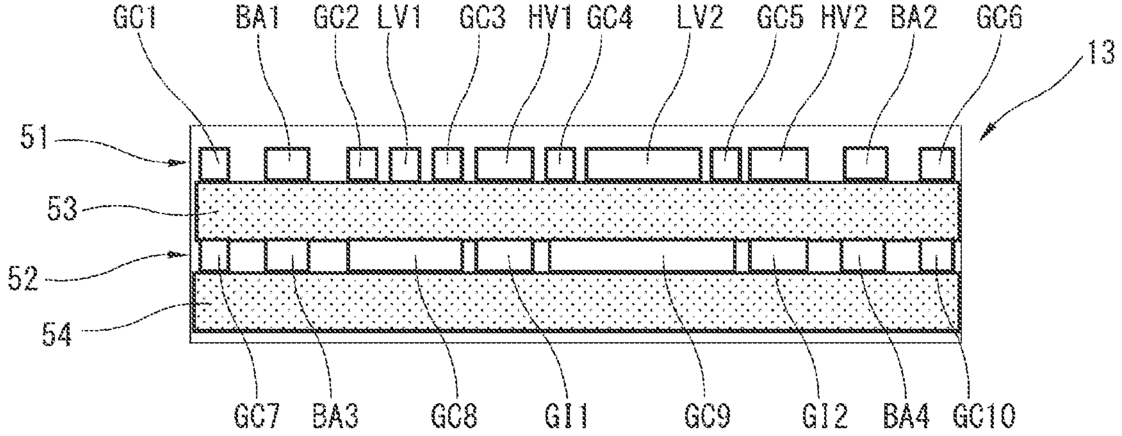
FIG. 18 is an illustrative view of the cross section similar to that of, for example, FIG. 8 in a fifth embodiment.

Next, a wiring layout in a fifth embodiment will be explained by referencing FIG. 18. FIG. 18 is a sectional view of the flexible part 13 similar, for example, to FIG. 8.

In the fifth embodiment, control circuit ground wirings GC1 to GC6, power source positive electrode wirings BA1 and BA2, low voltage signal wirings LV1 and LV2 and high voltage gate signal wirings HV1 and HV2 are disposed on the first layer. Control circuit ground wirings GC7 to CG10, power source positive electrode wirings BA3 and BA4 and inverter circuit ground wirings GI1 and GI2 are disposed on the second layer.

In this embodiment, although, as a whole, an asymmetrical configuration across the substrate center line M is used, two power source positive electrode wirings BA1 and BA3 included in one of the control systems are superimposed on each other in the lamination direction, and, similarly, two power source positive electrode wirings BA2 and BA4 included in the other of the control systems are superimposed on each other in the lamination direction. In addition, in case where three or more control systems are adopted, power source positive electrode wirings BA are similarly provided to each of the systems. In addition, in case where three or more metal foil layers are provided in the flexible part 13, power source positive electrode wirings BA which are provided on three or more layers and are included in the same system are disposed so as to be superimposed on each other in the lamination direction.

As the above, although one embodiment of the present invention has been explained in detail, the present invention is not limited to the above embodiments, and various changes might be made to the embodiments. For example, although power source terminals 40 are provided to the first rigid part 11 to supply power to the second rigid part 12 via power source positive electrode wirings BA in the above embodiments, a power source terminal may be provided to the second rigid part 12 to supply power to the first rigid part 11 via a power source positive electrode wiring BA. In addition, although the flexible part 13 has a fixed width and formed in a belt-shape in the above embodiments, even if the flexible part does not have such a simple shape, the present invention can be applied. In addition, although the flexible part 13 is configured by removing six layers from the circuit substrate having an eight-layer structure in the above embodiments, the present invention is not limited to such a configuration. In addition, although the width of the flexible part 13 in the W direction is narrower than that of the rigid parts 11 and 12 in the W direction, it is not requirement.

In addition, the present invention is not limited to the above-mentioned circuit substrate of an electric actuator for a power steering apparatus and can be applied to an electronic circuit device for various uses.

The invention claimed is:

1. An electronic device comprising a multilayer circuit substrate, wherein the circuit substrate includes:

at least two component mounting parts on each of which at least one electronic component is mounted;

a flexible part positioned between adjacent two of the component mounting parts and formed to be thinner than a thickness of a respective substrate of each component mounting part of the adjacent two component mounting parts so as to have higher flexibility than that of each component mounting part of the adjacent two component mounting parts, wherein the flexible part includes a first layer and a second layer different from each other;

a power source input terminal provided on one of the component mounting parts; and for each of the first layer and the second layer, two power source positive electrode wirings extending between the adjacent two component mounting parts in the flexible part to supply power to one of the adjacent component mounting parts to which the power source input terminal is not provided, and the power source positive electrode wirings of the first layer are arranged at respective positions at which they are at least partially superimposed on the respective power source positive electrode wirings of the second layer when being projected in a lamination direction of the circuit substrate, and wherein the flexible part further includes a plurality of signal wirings and a control circuit ground wiring extending between the two adjacent component mounting parts, and wherein a low voltage signal wiring of the plurality of signal wirings which is provided on the first layer is provided so as to be superimposed on the control circuit ground wiring provided on the second layer, in the lamination direction.

2. The electronic device according to claim 1, wherein the power source positive electrode wirings of the first layer and the signal wirings of the second layer are positioned so as not to be superimposed on each other.

3. The electronic device according to claim 1, wherein the flexible part further includes a high voltage gate signal wiring and an inverter circuit ground wiring extending between the two adjacent component mounting parts, and wherein, in a same layer, the power source positive electrode wirings are not adjacent to the low voltage signal wiring.

4. The electronic device according to claim 3, wherein, in a same layer, the power source positive electrode wirings are each positioned between the control circuit ground wiring and an additional control circuit ground wiring.

5. The electronic device according to claim 3, wherein, in a same layer, the power source positive electrode wirings are each positioned between the high voltage gate signal wiring and the control circuit ground wiring.

6. The electronic device according to claim 3, wherein, in a same layer, the power source positive electrode wirings are each positioned between the control circuit ground wiring and the inverter circuit ground wiring.

7. The electronic device according to claim 3, wherein, when the flexible part is projected along the lamination direction of the circuit substrate, in a positional relationship in a width direction of the flexible part, the high voltage gate signal wiring and the inverter circuit ground wiring are positioned on inner sides of the power source positive electrode wirings, and the low voltage signal wiring and the control circuit ground wiring are positioned on inner sides of the high voltage gate signal wiring and the inverter circuit ground wiring.

8. The electronic device according to claim 1, wherein the circuit substrate includes at least two control systems, wherein the power source positive electrode wirings are provided to each of the control systems, and wherein each of the power source positive electrode wirings of the control systems includes at least two power source positive electrode wirings superimposed on each other in the lamination direction in the flexible part.

* * * * *